(12) United States Patent
Tomita et al.

(10) Patent No.: US 11,287,483 B2
(45) Date of Patent: Mar. 29, 2022

(54) METHOD AND DEVICE FOR CALCULATING CORE LOSS

(71) Applicant: TAIYO YUDEN CO., LTD., Tokyo (JP)

(72) Inventors: Azusa Tomita, Tokyo (JP); Yasunori Tanahashi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 76 days.

(21) Appl. No.: 16/695,836

(22) Filed: Nov. 26, 2019

(65) Prior Publication Data

US 2020/0174056 A1    Jun. 4, 2020

(30) Foreign Application Priority Data

Nov. 29, 2018  (JP) .............................. JP2018-223997

(51) Int. Cl.
*G01R 31/62* (2020.01)
*H01F 1/12* (2006.01)

(52) U.S. Cl.
CPC .............. *G01R 31/62* (2020.01); *H01F 1/12* (2013.01)

(58) Field of Classification Search
CPC ........ G01R 31/62; H01F 1/12; H01F 324/546
USPC ...... 324/546; 252/62.56, 62.6, 62.61, 62.62; 366/233, 178
See application file for complete search history.

(56) References Cited

FOREIGN PATENT DOCUMENTS

JP         2012-026960 A      2/2012

*Primary Examiner* — Jermele M Hollington
*Assistant Examiner* — Courtney G McDonnough
(74) *Attorney, Agent, or Firm* — Pillsbury Winthrop Shaw Pittman, LLP

(57) ABSTRACT

One object is to provide a method and a device for calculating core loss accurately. A calculation method includes: calculating core loss characteristics of a magnetic part having no superimposed direct current flowing therein, the magnetic part being made of one or more magnetic materials; and calculating a value of core loss of the magnetic part by multiplying the core loss characteristics by a rate of change of the core loss of the magnetic part caused by a superimposed direct current.

11 Claims, 10 Drawing Sheets

METHOD AND DEVICE FOR CALCULATING CORE LOSS

CROSS-REFERENCE TO RELATED APPLICATIONS

This application is based on and claims the benefit of priority from Japanese Patent Application Serial No. 2018-223997 (filed on Nov. 29, 2018), the contents of which are hereby incorporated by reference in their entirety.

TECHNICAL FIELD

The present invention relates to a method and a device for calculating core loss.

BACKGROUND

When an alternating current flows in a magnetic part made of one or more magnetic materials, a loss (that is, core loss) is generated due to change of magnetic flux and eddy currents in the magnetic part. Core loss changes depending on the physical properties of a material used in the core of the magnetic part, the shape and the structure of the magnetic part, and the frequency and the amplitude of the alternating current flowing in the magnetic part. Accordingly, it is necessary to calculate a value of core loss in accordance with the use conditions of the magnetic part. For example, Japanese Patent Application Publication No. 2012-26960 discloses a method of estimating core loss in which a core loss function using a magnetic bias, an amplitude, and a frequency of an alternating magnetic field is set based on magnetic characteristics data of a soft magnetic material under the biased state, and a value of carrier loss of the soft magnetic material is calculated based on the core loss function and a value of magnetic flux density.

However, since conventional calculation methods do not take account of the effect of the superimposed direct current flowing in the magnetic part on the core loss, there may be a difference between a calculated value and the value of the core loss under actual use conditions. Therefore, it is difficult to calculate the value of the core loss accurately.

SUMMARY

One object of the present invention is to provide a method and a device for calculating core loss accurately. Other objects of the present invention will be made apparent through description in the entire specification.

A calculation method according to an embodiment of the present invention comprises: calculating core loss characteristics of a magnetic part having no superimposed direct current flowing therein, the magnetic part being made of one or more magnetic materials; and calculating a value of core loss of the magnetic part by multiplying the core loss characteristics by a rate of change of the core loss of the magnetic part caused by a superimposed direct current.

This calculation method includes calculating a value of core loss of the magnetic part by multiplying the core loss characteristics by a rate of change of the core loss of the magnetic part caused by a superimposed direct current. Therefore, the effect of the superimposed direct current on the core loss is reflected on the calculation result in accordance with the actual use condition, thereby to increase the accuracy of the calculation of the core loss.

In an embodiment of the present invention, the calculation method may further comprise calculating the rate of change.

In an embodiment of the present invention, the calculation method may further comprise: measuring the core loss of the magnetic part having no superimposed direct current flowing therein; and measuring the core loss of the magnetic part having the superimposed direct current flowing therein, for each of a plurality of superimposed direct current values.

In an embodiment of the present invention, the core loss characteristics may be calculated by Formula (A) below, Formula (A) being formed from the Steinmetz formula with a maximum AC magnetic flux density replaced with an alternating current. In an actual circuit, an electric current flowing in the magnetic part can be measured more easily than the magnetic field generated in the magnetic part. Therefore, the core loss characteristics can be calculated easily by using Formula (A) with a maximum AC magnetic flux density replaced with an alternating current.

$$P_{core}=k'_h I_{ac}^\beta f + k'_e (I_{ac}f)^2 + k'_r (I_{ac}f)^{1.5} \quad (A)$$

In Formula (A), $P_{core}$ is the core loss characteristics, f is a frequency, $I_{ac}$ is the alternating current, and $k'_h$, $k'_e$, and $k'_r$ are coefficients.

In an embodiment of the present invention, the core loss characteristics may be calculated by Formula (B) below, Formula (B) being a simplification of the Steinmetz formula with a maximum AC magnetic flux density replaced with an alternating current. Use of the formula more simplified than Formula (A) further facilitates the calculation of the core loss characteristics.

$$P_{core}=A \cdot f^B \cdot I_{ac}^C \quad (B)$$

In Formula (B), $P_{core}$ is the core loss characteristics, f is a frequency, $I_{ac}$ is an alternating current, and A, B, and C are coefficients.

In an embodiment of the present invention, the rate of change of the core loss may be calculated by a formula based on an exponential function. The formula may be Formula (C) below.

$$g(I_{dc})=\exp(-D \cdot I_{dc}^E) \quad (C)$$

In Formula (C), $g(I_{dc})$ is the rate of change of the core loss, $I_{dc}$ is the superimposed direct current, and D and E are coefficients.

In an embodiment of the present invention, the rate of change of the core loss may be calculated by a formula based on an n-th degree function. The formula may be Formula (D) below.

$$g(I_{dc})=\Sigma_{i=1}^{n}(D_i I_{dc}^i)+1 \quad (D)$$

In Formula (D), $g(I_{dc})$ is the rate of change of the core loss, $I_{dc}$ is the superimposed direct current, $D_i$ is a coefficient, and i and n are natural numbers.

In an embodiment of the present invention, the rate of change of the core loss may be calculated by a formula including a multiplication between exponential functions. The formula may be Formula (E) below.

$$g(I_{dc})=\exp(-D_1 \cdot I_{dc}^{E1}) \cdot \exp(-D_2 \cdot I_{dc}^{E2}) \cdot \ldots \cdot \exp(-D_n \cdot I_{dc}^{En}) \quad (E)$$

In Formula (E), $g(I_{dc})$ is the rate of change of the core loss, $I_{dc}$ is the superimposed direct current, $D_i$ and $E_i$ are coefficients, and i and n are natural numbers.

A calculation device according to an embodiment of the present invention comprises: one or more computer processors, wherein the one or more computer processors execute computer-readable instructions to: calculate core loss characteristics of a magnetic part having no superimposed direct current flowing therein, the magnetic part being made of one or more magnetic materials; and calculate a value of core loss of the magnetic part by multiplying the calculated core loss characteristics by a rate of change of the core loss of the magnetic part caused by a superimposed direct current.

Advantages

The present invention provides a method and a device for calculating core loss accurately.

DESCRIPTION OF THE EMBODIMENTS

Various embodiments of the invention will be described hereinafter with reference to the drawings. Elements common to a plurality of drawings are denoted by the same reference signs throughout the plurality of drawings. It should be noted that the drawings do not necessarily appear to an accurate scale for convenience of explanation.

Figure 1:
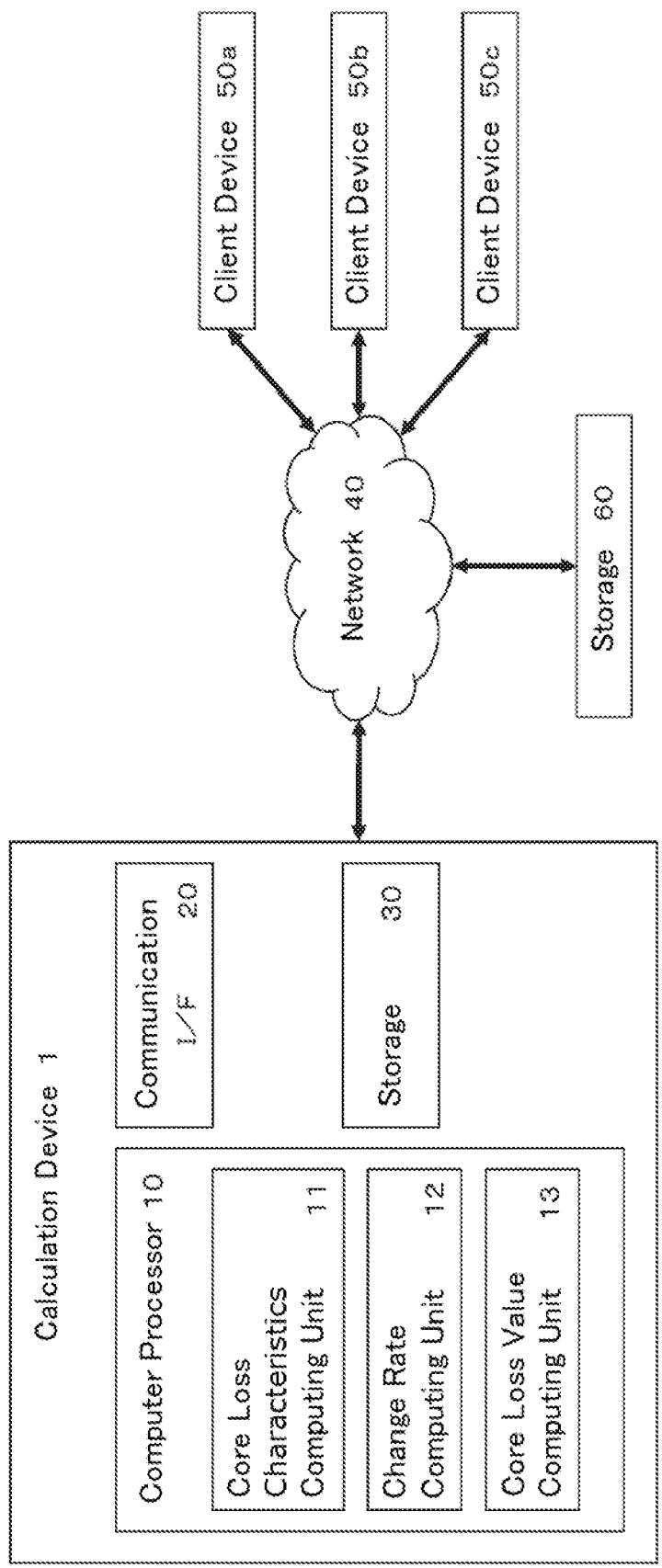
FIG. 1 shows a system including a core loss calculation device according to an embodiment.

FIG. 1 shows a system including a core loss calculation device 1 according to an embodiment. The calculation device 1 shown in FIG. 1 calculates core loss of a magnetic part (not shown) made of one or more magnetic materials such as a coil part of a wire-wound coil or a laminated coil, an inductor part, or a bead inductor used for eliminating high frequency noise. More specifically, the calculation device 1 calculates core loss generated at a magnetic part used in an actual circuit under predetermined conditions. As shown in FIG. 1, the calculation device 1 includes a computer processor 10, a communication I/F 20, and a storage 30. The calculation device 1 is communicably interconnected with a plurality of client devices 50a to 50c over the network 40, for example.

The computer processor 10 is a computing device which loads an operating system and various programs implementing various functions from the storage 20 or other storage into a memory unit and executes instructions included in the loaded programs. The computer processor 10 is, for example, a CPU, an MPU, a DSP, a GPU, any other computing device, or a combination thereof. The computer processor 10 may be embodied by means of an integrated circuit such as ASIC, PLD, FPGA, MCU, or the like. Although the computer processor 10 is illustrated as a single component in FIG. 1, the computer processor 10 may be a collection of a plurality of physically separate computer processors. The programs or the instructions included in the programs that are described herein as being executed by the computer processor 10 may be either executed by a single computer processor or executed by a plurality of computer processors distributively. Further, the programs or the instructions included in the programs executed by the computer processor 10 may be executed by a plurality of virtual computer processors.

The communication I/F 20 may be implemented as hardware, firmware, or communication software such as a TCP/IP driver or a PPP driver, or a combination thereof. The calculation device 1 is able to transmit and receive data to and from other devices (for example, the client devices 50a to 50c) via the communication I/F 20.

The storage 30 is a storage device accessed by the computer processor 10. The storage 30 is, for example, a magnetic disk, an optical disk, a semiconductor memory, or various other storage device capable of storing data. Various programs may be stored in the storage 30. At least some of the programs and various data that may be stored in the storage 30 may be stored in a storage (for example, a storage 60) that is physically separated from the calculation device 1. Formulas and data used in the core loss calculation method according to the embodiment are stored in the storage 30 or the storage 60.

Functions embodied by the computer processor 10 of the calculation device 1 will be now described more specifically. The computer processor 10 functions as a core loss characteristics computing unit 11, a change rate computing unit 12, and a core loss value computing unit 13 by executing computer readable instructions. The core loss characteristics computing unit 11 calculates core loss characteristics of a magnetic part (not shown) having no superimposed direct current flowing therein. The change rate computing unit 12 calculates a rate of change of core loss of the magnetic part generated by a superimposed direct current. The core loss value computing unit 13 multiplies the core loss characteristics calculated by the core loss characteristics computing unit 11 by the rate of change of core loss calculated by the change rate computing unit 12. At least some of the functions that can be embodied by the computer processor 10 may be embodied by a computer processor other than the computer processor 10 of the calculation device 1. For example, at least some of the functions embodied by the computer processor 10 may be embodied by the computer processors mounted on the client devices 50a to 50c.

Figure 2:
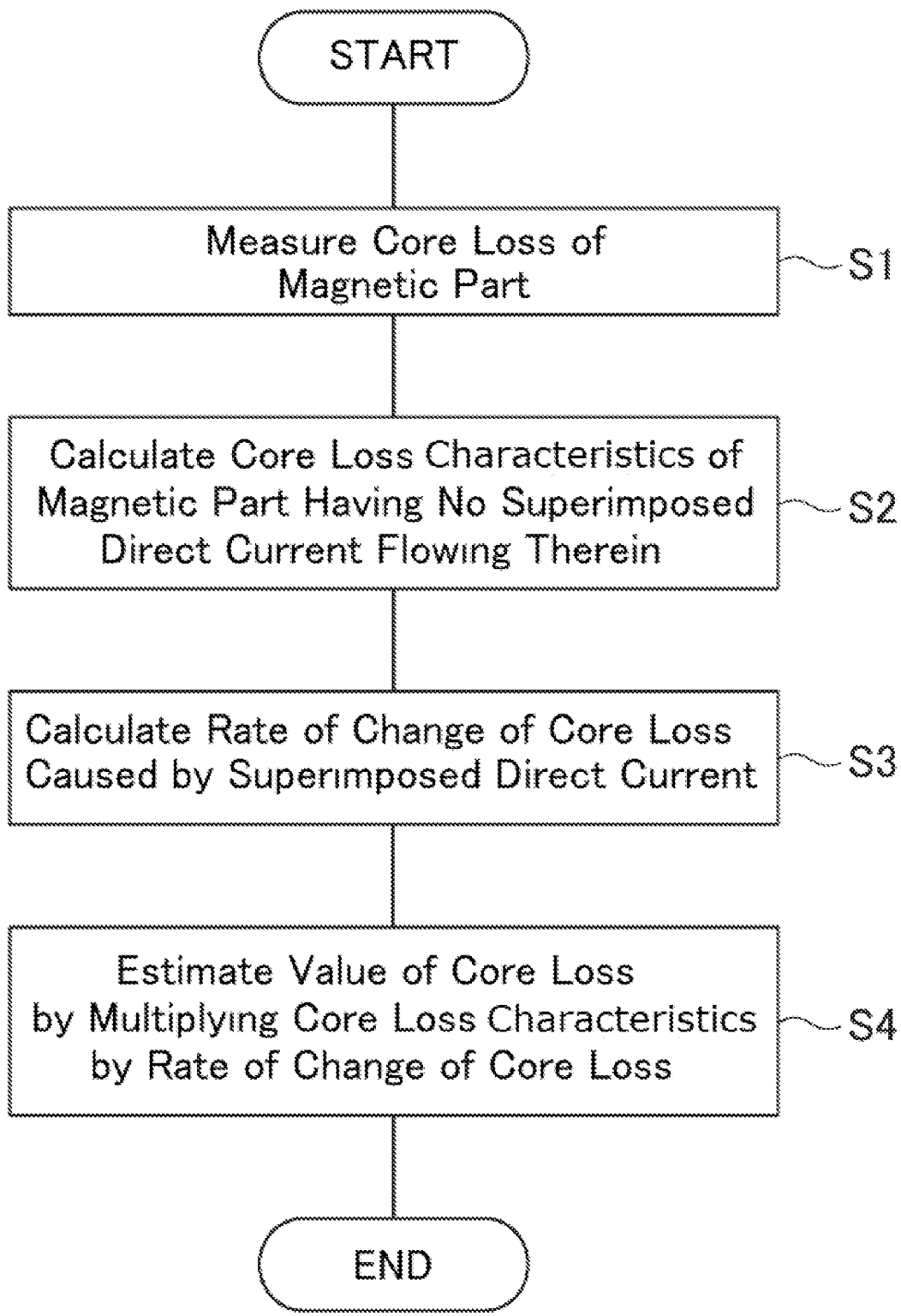
FIG. 2 is a flowchart showing a core loss calculation method according to the embodiment.

With reference to FIG. 2, a description is given of a core loss calculation method according to the embodiment. FIG. 2 is a flowchart showing a core loss calculation method according to the embodiment.

In the core loss calculation method according to the embodiment, the first step is to measure the core loss of the magnetic part with a plurality of conditions set for each of a frequency f, an alternating current $I_{ac}$, and a superimposed direct current $I_{dc}$ (step S1). More specifically, the core loss is measured at the magnetic part having no superimposed direct current $I_{dc}$ flowing therein. The core loss is also measured at the magnetic part having the superimposed direct current $I_{dc}$ flowing therein, for each of a plurality of superimposed direct current values. The core loss is measured by a known measurement technique such as the BH analyzer or the LC resonance. The core loss value measured under each condition is stored in, for example, the storage 30 of the calculation device 1 or the storage 60.

Next, core loss characteristics of the magnetic part having no superimposed direct current flowing therein is calculated based on the core loss value measured in step S1 (step S2). Calculation of the core loss characteristics is performed by the core loss characteristics computing unit 11 of the computer processor 10. The core loss characteristics may be calculated by, for example, Formula (1) below, which is formed by converting the Steinmetz formula, a known formula related to core loss of magnetic materials. Formula (1) is formed from the Steinmetz formula with the maximum AC magnetic flux density replaced with the alternating current $I_{ac}$. In Formula (1), $P_{core}$ is core loss characteristics, f is a frequency, $I_{ac}$ is an alternating current, and $k_h'$, $k_e'$, and $k_r'$ are coefficients. The first term of Formula (1) represents a loss caused by hysteresis. The second term of Formula (1) represents a loss caused by eddy currents. The third term of Formula (1) represents a residual loss.

$$P_{core}=k'_h I_{ac}^\beta f+k'_e(I_{ac}f)^2+k'_r(I_{ac}f)^{1.5} \qquad (1)$$

Formula (2), formed by simplifying Formula (1), may be used in the calculation of the core loss characteristics $P_{core}$. In Formula (2), the third term of Formula (1) representing the residual loss is omitted, and the first term representing the loss caused by hysteresis and the second term representing the loss caused by eddy currents are put together. In Formula (2), $P_{core}$ is core loss characteristics, f is a frequency, $I_{ac}$ is an alternating current, and A, B, and C are coefficients.

$$P_{core}=A \cdot f^B \cdot I_{ac}^C \qquad (2)$$

Figure 3:
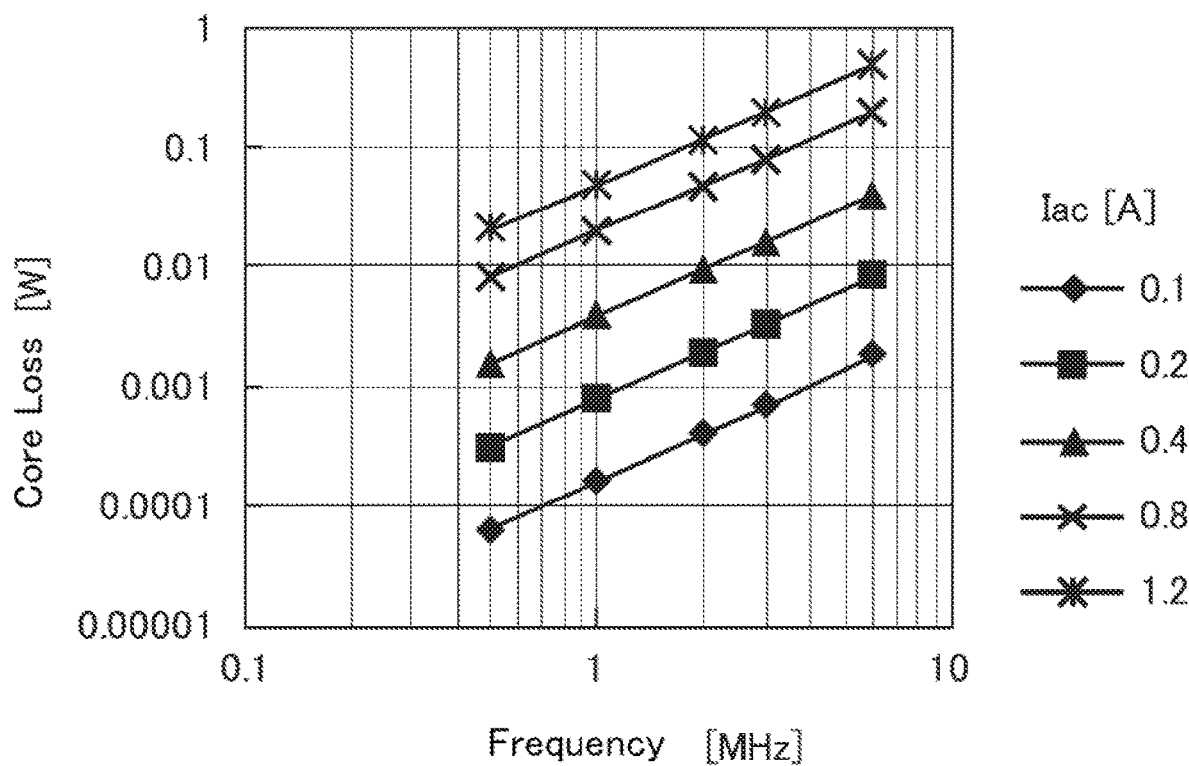
FIG. 3 is a graph showing a relationship between core loss and frequency.
Figure 4:
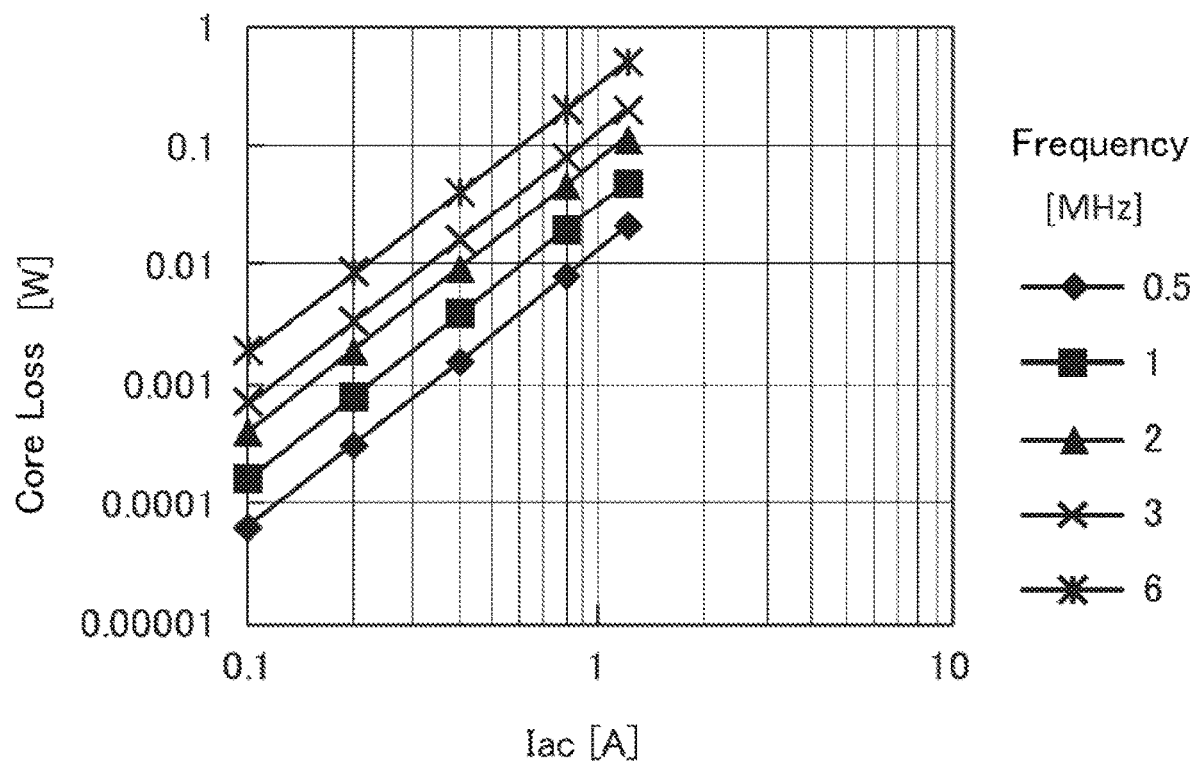
FIG. 4 is a graph showing a relationship between core loss and alternating current.

The calculation method of the core loss characteristics used in step S2 will now be described with reference to FIGS. 3 and 4. FIG. 3 is a graph showing a relationship between the core loss and the frequency. FIG. 4 is a graph showing a relationship between the core loss and the alternating current. FIG. 3 shows data for five conditions where the alternating current $I_{ac}$ is 0.1 A, 0.2 A, 0.4 A, 0.8 A, and 1.2 A, respectively. FIG. 4 shows data for five conditions where the frequency f is 0.5 MHz, 1 MHz, 2 MHz, 3 MHz, and 6 MHz, respectively. By means of an example, this embodiment uses Formula (2) for calculation of the core loss characteristics. In use of Formula (2), the coefficients A, B, and C are fitted such that the data shown in FIGS. 3 and 4 correspond to the characteristics of Formula (2). The coefficient B in Formula (2) corresponds to the gradient of the core loss to the frequency in the double logarithmic graph shown in FIG. 3. The coefficient C in Formula (2) corresponds to the gradient of the core loss to the alternating current in the double logarithmic graph shown in FIG. 4. The coefficient A in Formula (2) can be calculated with the coefficient B determined from the core loss to the frequency (FIG. 3) and the coefficient C determined from the core loss to the alternating current (FIG. 4). The core loss characteristics can be calculated as described above.

Figure 5A:
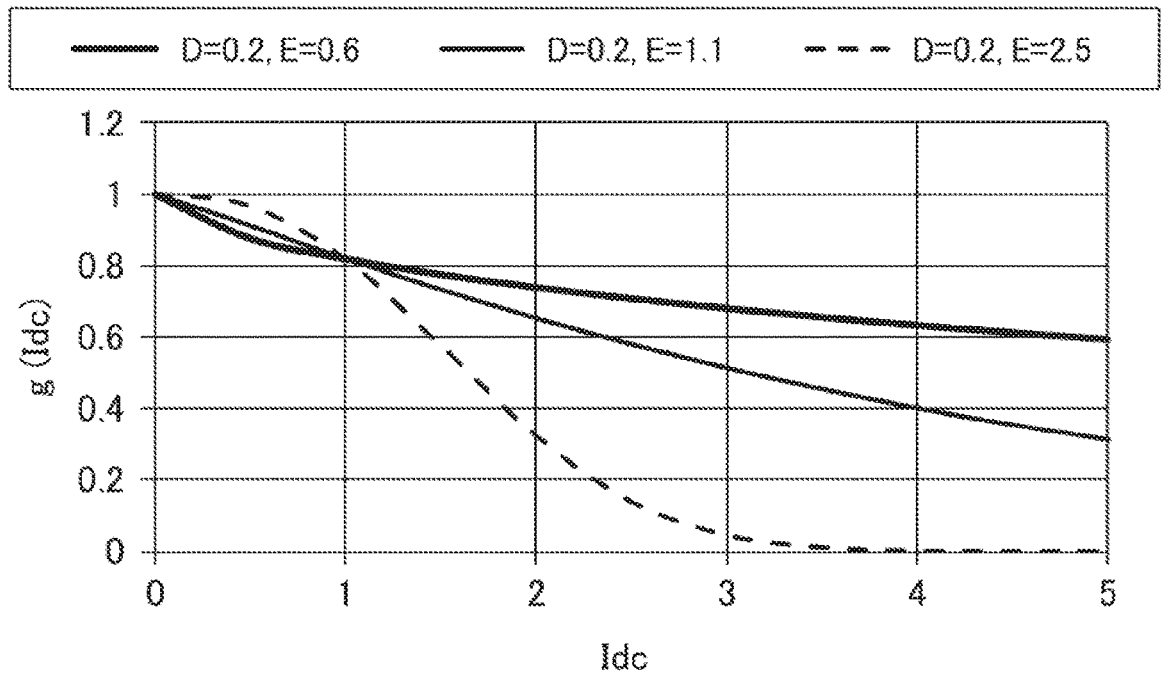
FIG. 5A is a graph showing a change of a characteristic curve according to coefficients D, E in Formula (3).
Figure 5B:
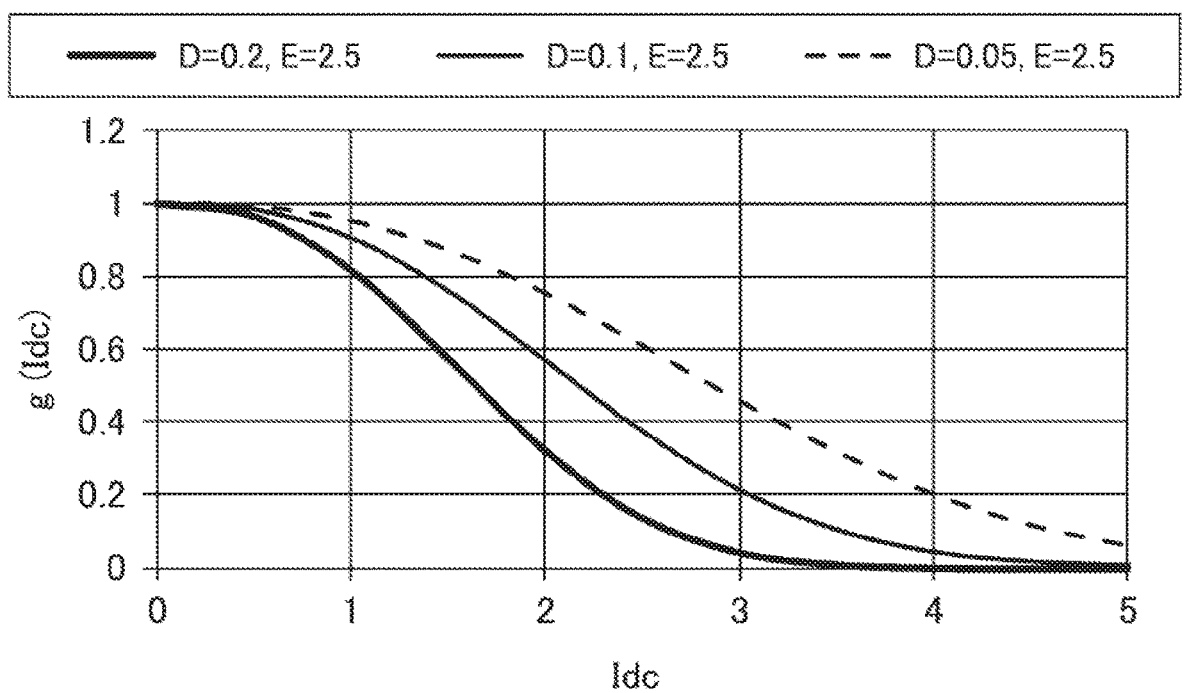
FIG. 5B is a graph showing a change of a characteristic curve according to coefficients D, E in Formula (3).

Next, the rate of change of the core loss caused by the superimposed direct current $I_{dc}$ is calculated based on the data related to the superimposed direct current $I_{dc}$ measured in step S1 (step S3). Calculation of the rate of change is performed by the change rate computing unit 12 of the computer processor 10. The rate of change may be calculated by, for example, Formula (3) below. Formula (3) is based on an exponential function. In Formula (3), $g(I_{dc})$ is a rate of change of the core loss caused by the superimposed direct current, $I_{dc}$ is the superimposed direct current, and D and E are coefficients. A description is now given of an effect of the coefficients D, E in Formula (3) with reference to FIGS. 5A and 5B. FIG. 5A is a graph showing a change of a characteristic curve with the coefficient D remaining constant and the coefficient E changed. FIG. 5B is a graph showing a change of a characteristic curve with the coefficient D changed and the coefficient E remaining constant. As shown in FIGS. 5A and 5B, the characteristic curve can have various shapes with adjustment of the coefficients D, E of Formula (3). The characteristics of the core loss of the magnetic part caused by the superimposed direct current $I_{dc}$ may have a characteristic curve having different features in accordance with the type of the magnetic material, the structure of the magnetic part, and so on. Formula (3), a single formula, with adjusted coefficients D, E makes it possible to express the characteristics of the core loss for various types of magnetic parts caused by the superimposed direct current $I_{dc}$.

$$g(I_{dc})=\exp(-D \cdot I_{dc}^E) \qquad (3)$$

Figure 6:
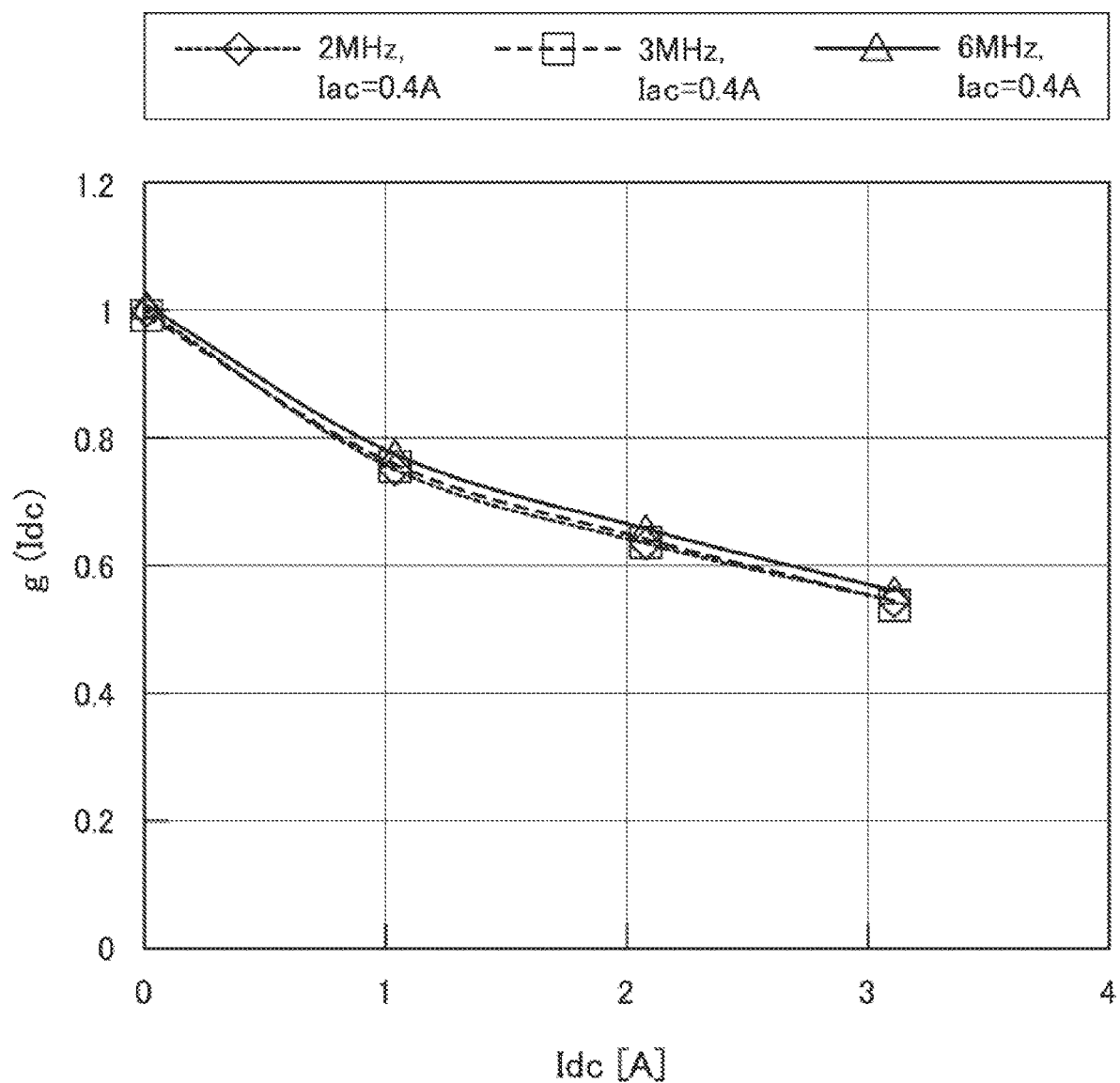
FIG. 6 is a graph showing a relationship between core loss and superimposed direct current.

FIG. 6 is a graph showing a relationship between the core loss and the superimposed direct current. FIG. 6 shows data for three conditions where the alternating current $I_{ac}$ is fixed at 0.4 A and the frequency f is 2 MHz, 3 MHz, and 6 MHz, respectively. The data shown in FIG. 6 is normalized with a reference of the value of the core loss for the case where the superimposed direct current $I_{dc}$ is zero. The rate of change of the core loss caused by the superimposed direct current $I_{dc}$ is calculated by fitting the coefficients D, E such that the characteristic curve of FIG. 6 corresponds to the characteristic curve expressed by Formula (3).

Next, a value of the core loss is calculated by multiplying the core loss characteristics $P_{core}$ calculated in step S2 by the rate of change $g(I_{dc})$ of the core loss caused by the superimposed direct current $I_{dc}$ calculated in step S3 (step S4). That is, the value of the core loss is calculated by computing Formula (4) below. Calculation of the value of the core loss is performed by the core loss value computing unit 13 of the computer processor 10.

$$P_{core}=A \cdot f^B \cdot I_{ac}^C \cdot \exp(-D \cdot I_{dc}^E) \qquad (4)$$

Figure 7:
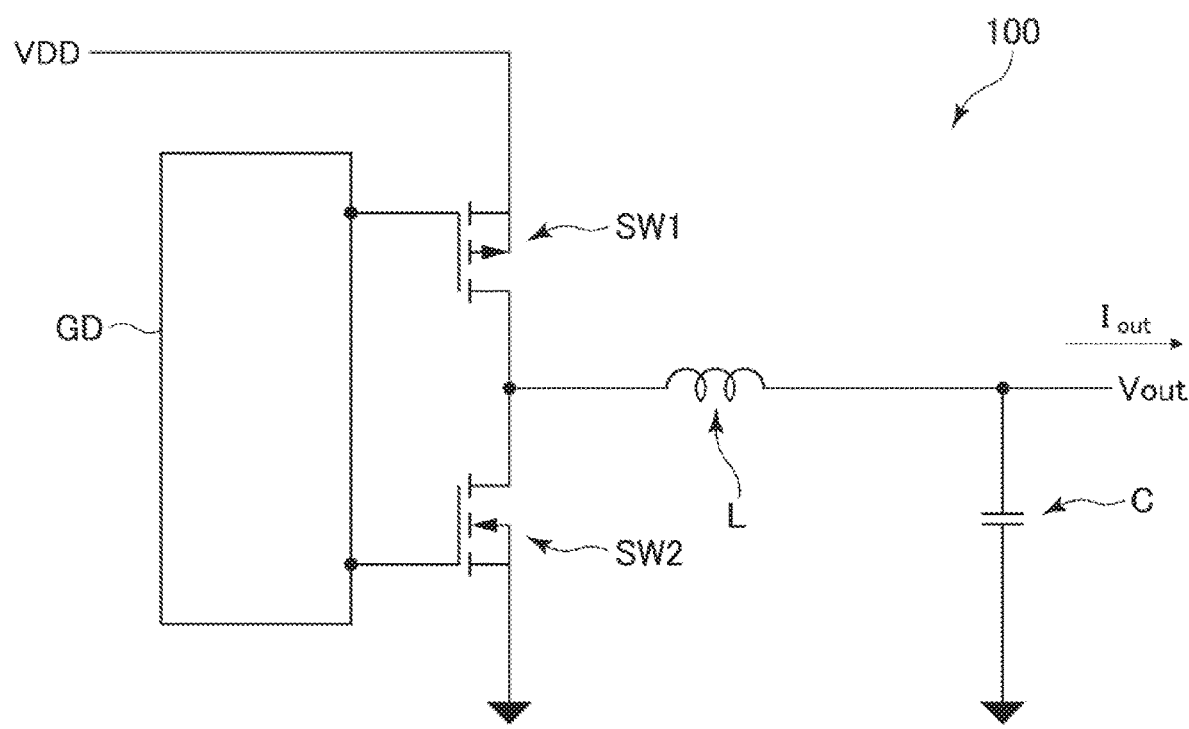
FIG. 7 shows an example of a circuit including a magnetic part.
Figure 8:
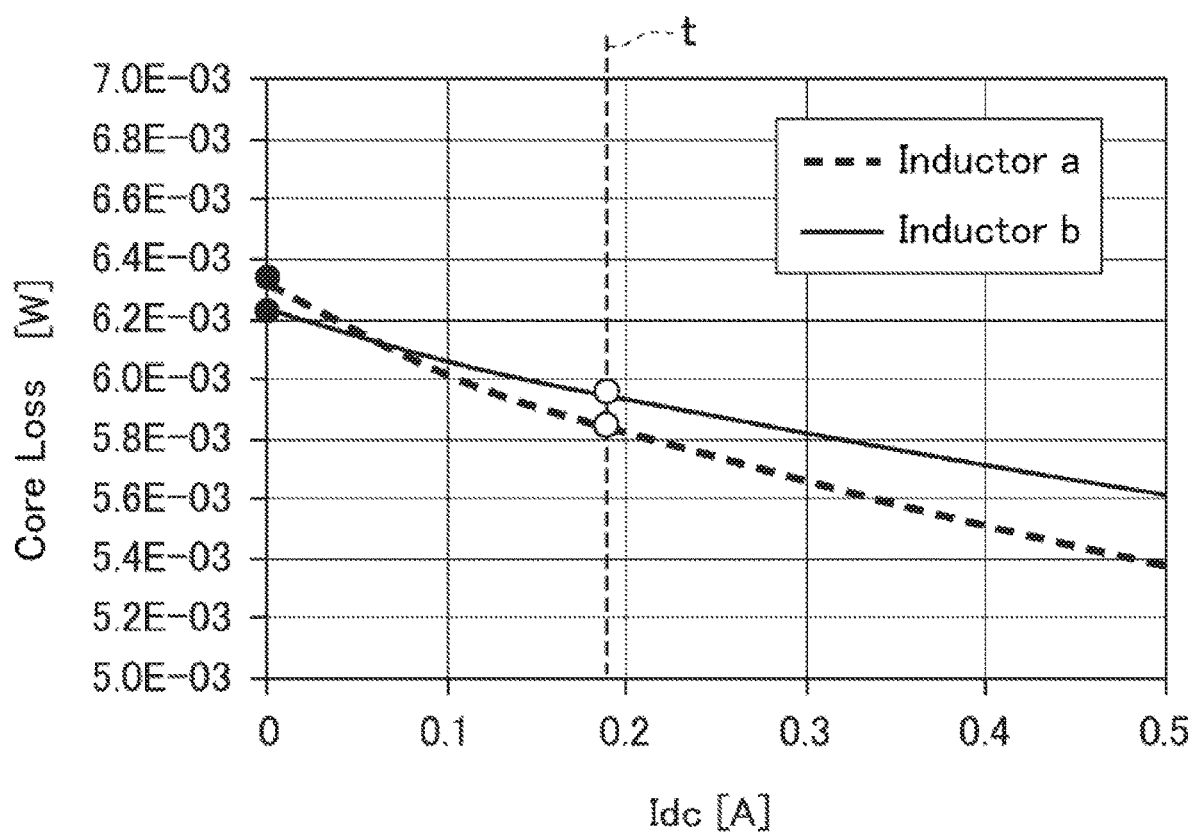
FIG. 8 is a graph showing a result of calculation with the calculation device and the calculation method according to the embodiment.
Figure 9:
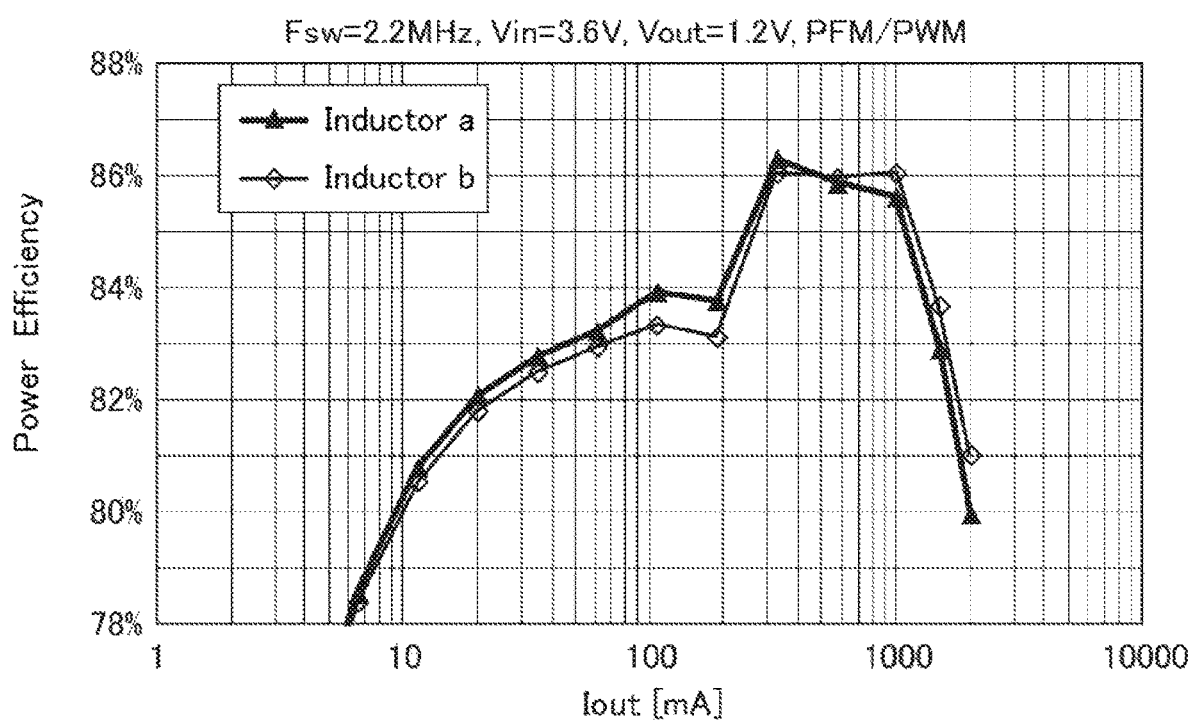
FIG. 9 is a graph showing actual measurements of power efficiency of the circuit of FIG. 7.

With reference to FIGS. 7 to 9, a description is given of an example of a result of calculating the core loss by the calculation device and the calculation method according to the embodiment, as well as the effect of the calculation device and the calculation method according to the embodiment. FIG. 7 shows an example of a circuit including a magnetic part. FIG. 8 is a graph showing a result of calculation with the calculation device and the calculation method according to the embodiment. FIG. 9 is a graph showing actual measurements of power efficiency of the circuit of FIG. 7. By way of an example, the following description is based on a case where the magnetic part used in the circuit of FIG. 7 is an inductor.

The circuit 100 shown in FIG. 7 is what is called a step-down power supply circuit and includes: an inductor L as a magnetic part; switching elements SW1, SW2; a gate driver GD for driving the switching elements SW1, SW2; and a capacitor C. The switching elements SW1, SW2 are formed of MOSFETs, for example. The power efficiency in the circuit 100 changes in accordance with the core loss of the inductor L. More specifically, the power efficiency in the circuit 100 is lower as the value of the core loss of the inductor L is larger, and the power efficiency in the circuit 100 is higher as the value of the core loss of the inductor L is smaller. Therefore, in designing the circuit 100, it is necessary to select the inductor L so as to have such a value of the core loss that increases the power efficiency in the circuit 100.

FIG. 8 shows a result of calculating the value of the core loss for two types of inductors, an inductor a and an inductor b, with the calculation method according to the embodiment (the calculation method using Formula (4)). Each of the inductor a and the inductor b is a magnetic part that can be used as the inductor L (see FIG. 7) and has substantially the same inductance. The values of the coefficients in Formula (4) calculated for the inductor a are as follows: A=0.02065, B=1.3016, C=2.2841, D=0.2705, and E=0.7387. Likewise, the values of the coefficients in Formula (4) calculated for the inductor b are as follows: A=0.01529, B=1.4292, C=2.0928, D=0.1833, and E=0.8139. In FIG. 8, the values of the core loss for the case where the superimposed direct current $I_{dc}$=0 corresponds to the value of the core loss obtained when the effect of the superimposed direct current $I_{dc}$ is not taken into account. As shown in FIG. 8, for $I_{dc}$=0, the value of the core loss of the inductor a is larger than that of the inductor b. Therefore, supposing that the conventional calculation method (for example, the calculation method using Formula (2)) not taking account of the effect of the superimposed direct current $I_{dc}$ is used, the value of the core loss does not change with the superimposed direct current $I_{dc}$, and thus it can be presumed that the inductor b should be selected to increase the power efficiency.

However, the actual values of the core loss of the inductor a and the inductor b change in accordance with the actual use condition in the circuit 100 (see FIG. 6). This may result in a difference between the calculated value and the value of the core loss under the actual use condition when the effect of the superimposed direct current $I_{dc}$ on the core loss is not taken into account. In contrast, with the calculation method according to the embodiment, the effect of the superimposed direct current $I_{dc}$ on the core loss is reflected on the calculation result, thereby to increase the accuracy of the calculation of the core loss. For example, as shown in FIG. 8, at the point of the dotted line t (corresponding to the superimposed direct current $I_{dc}$ for the output current $I_{out}$ of the circuit 100=100 mA), the value of the core loss of the inductor a is calculated to be smaller than that of the inductor b, contrary to the case where $I_{dc}$=0. From this calculation result, it can be presumed that the inductor a should be selected instead of the inductor b when the circuit 100 operates under the use condition of the output current $I_{out}$=100 mA.

FIG. 9 shows actual measurements of the power efficiency for the cases where the inductor a and the inductor b are used as the inductor L of the circuit 100 shown in FIG. 7. The data shown in FIG. 9 are measured under the conditions of the switching frequency $F_{SW}$=2.2 MHz, the input voltage $V_{in}$=3.6 V, and the output voltage $V_{out}$=1.2 V. As shown in FIG. 9, the power efficiency of the inductor a is higher than that of the inductor b under the condition of the output current $I_{out}$=100 mA. This result confirms that the calculation method according to the embodiment increases the accuracy of the calculation of the core loss.

As described above, the core loss calculation method according to the embodiment includes the step of multiplying the core loss characteristics $P_{core}$ by the rate of change $g(I_{dc})$ of the core loss of the magnetic part caused by the superimposed direct current $I_{dc}$ to calculate the value of the core loss of the magnetic part. Therefore, the effect of the superimposed direct current $I_{dc}$ on the core loss is reflected on the calculation result in accordance with the actual use condition, thereby to increase the accuracy of the calculation of the core loss.

In step S2, it is also possible to use Formula (2) to calculate the core loss characteristics, Formula (2) being a simplification of Formula (1) formed from the Steinmetz formula with the maximum AC magnetic flux density replaced with the alternating current. In an actual circuit, an electric current flowing in the magnetic part can be measured more easily than the magnetic field generated in the magnetic part. Therefore, the core loss characteristics $P_{core}$ can be calculated easily. In addition, use of the formula more simplified than Formula (1) further facilitates the calculation of the core loss characteristics $P_{core}$.

The core loss value computing unit 13 of the computer processor 10 of the core loss calculation device 1 according to the embodiment calculates the value of the core loss of the magnetic part by multiplying the core loss characteristics $P_{core}$ calculated by the core loss characteristics computing unit 11 by the rate of change $g(I_{dc})$ of the core loss of the magnetic part caused by the superimposed direct current $I_{dc}$. Therefore, the effect of the superimposed direct current $I_{dc}$ on the core loss is reflected on the calculation result in accordance with the actual use condition, thereby to increase the accuracy of the calculation of the core loss.

It is also possible that the core loss characteristics computing unit 11 of the computer processor 10 uses Formula (2) to calculate the core loss characteristics, Formula (2) being a simplification of Formula (1) formed from the Steinmetz formula with the maximum AC magnetic flux density replaced with the alternating current. In an actual circuit, an electric current flowing in the magnetic part can be measured more easily than the magnetic field generated in the magnetic part. Therefore, the core loss characteristics $P_{core}$ can be calculated easily. In addition, use of the formula more simplified than Formula (1) further facilitates the calculation of the core loss characteristics $P_{core}$.

The core loss calculation device 1 includes the communication I/F 20 for transmitting and receiving data to and from other devices via the network 40. This enables the calculation device 1 to present the calculation result of the core loss to the user of the magnetic part based on the operating condition of the circuit input via the client devices 50a to 50c. Accordingly, the user of the magnetic part can select a magnetic part having a low core loss value under the actual use condition based on the calculation result of the calculation device 1, resulting in a reduced number of fabricating prototype circuits and more efficient circuit design. Examples of the operating condition of the circuit include the frequency of the current flowing in the magnetic part, the alternating current value, and the superimposed direct current value. These values may be calculated from input information such as the circuit configuration of a DC/DC converter, an input voltage, an output voltage, and an operating frequency.

The present invention is not limited to the embodiment described above and is susceptible of various modifications. For example, the core loss characteristics $P_{core}$ may be calculated by Formula (1), instead of Formula (2) used in the embodiment described above. In the case, the effect of the residual loss omitted in Formula (2) is reflected on the calculation result, and therefore, the calculated result is still more accurate than that by Formula (2).

Further, it is also possible that the change rate computing unit 12 may use a formula based on an n-th degree function to calculate the rate of change of the core loss, instead of using Formula (3) that is based on an exponential function to calculate the rate of change as in the embodiment described above. In this case, Formula (5) below may be used. In Formula (5), $g(I_{dc})$ is the rate of change of the core loss, $I_{dc}$ is the superimposed direct current, $D_i$ is a coefficient, and i and n are natural numbers. In this way, Formula (5) based on an n-th degree function may be used to express the rate of change of the core loss caused by the superimposed direct current $I_{dc}$, as with Formula (3). Therefore, as in the embodiment described above, the effect of the superimposed direct current $I_{dc}$ on the core loss is reflected on the calculation result in accordance with the actual use condition, thereby to increase the accuracy of the calculation of the core loss.

$$g(I_{dc})=\Sigma_{i=1}^{n}(D_i \cdot I_{dc}^{i})+1 \tag{5}$$

The change rate computing unit 12 may use a formula including a multiplication between exponential functions to calculate the rate of change of the core loss. The formula may be Formula (6) below. In Formula (6), $g(I_{dc})$ is the rate of change of the core loss, $I_{dc}$ is the superimposed direct current, $D_i$ and $E_i$ are coefficients, and i and n are natural numbers.

$$g(I_{dc})=\exp(-D_1 \cdot I_{dc}^{E1}) \cdot \exp(-D_2 \cdot I_{dc}^{E2}) \cdot \ldots \cdot \exp(-D_n \cdot I_{dc}^{En}) \tag{6}$$

Figure 10:
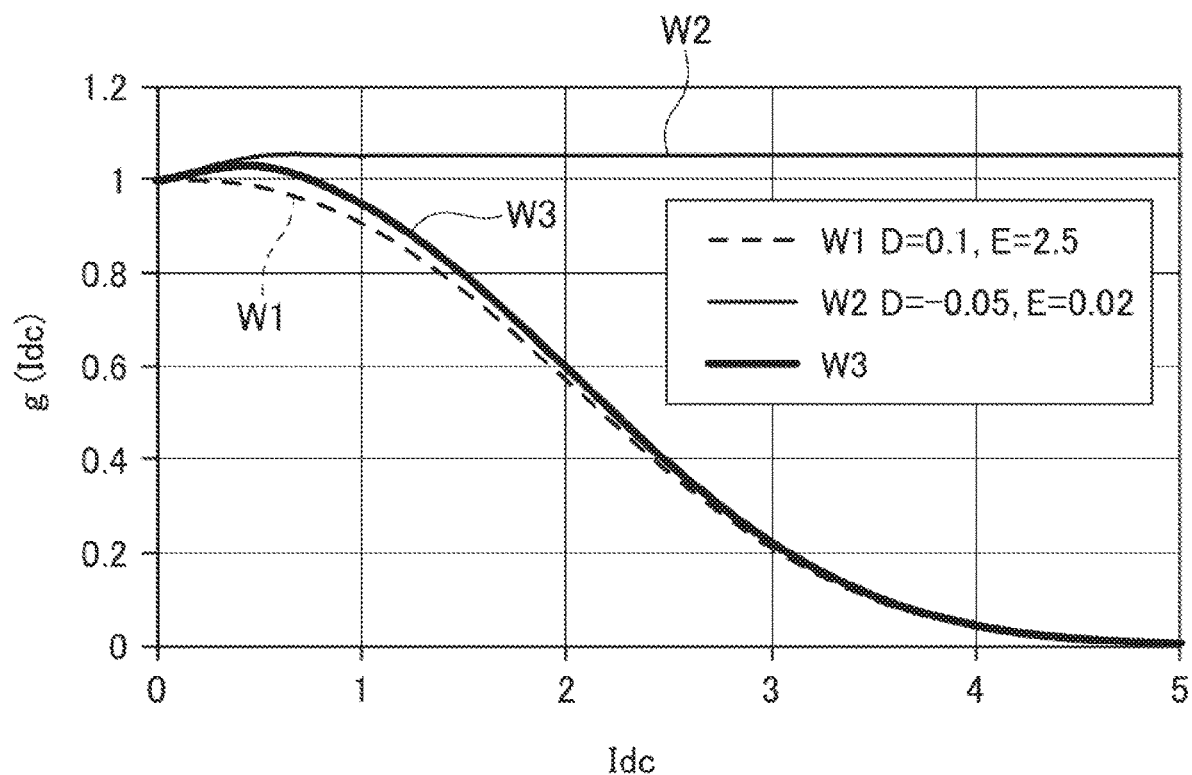
FIG. 10 is a graph showing an example of characteristic curves expressed by Formula (6).

FIG. 10 is a graph showing an example of a characteristic curve expressed by Formula (6). FIG. 10 shows characteristic curves obtained when Formula (6) is formed of multiplication of two exponential functions, the characteristic curves including the characteristic curve W1 of the first exponential function, the characteristic curve W2 of the second exponential function, and the characteristic curve W3 of the multiplication of the first and second exponential functions. By way of an example, the first exponential function has the coefficients $D_1=0.1$ and $E_1=2.5$, and the second exponential function has the coefficients $D_2=-0.05$ and $E_2=0.02$. As shown in FIG. 10, the characteristic curve W3 of the multiplication of the exponential functions starts at 1 when the superimposed direct current $I_{dc}=0$, temporarily exceeds 1 as the superimposed direct current $I_{dc}$ increases, and then falls below 1. As described above, in Formula (6), the sign of the coefficient $D_1$ of the first exponential function is inverse to the sign of the coefficient $D_2$ of the second exponential function, thereby expressing a characteristic curve of the rate of change $g(I_{dc})$ exceeding 1, which cannot be expressed by Formula (3). Accordingly, use of Formula (6) for calculating the rate of change of the core loss makes it possible to express the characteristics of core loss in a larger variety of magnetic parts.

In the embodiment described above, the change rate computing unit 12 calculates the rate of change $g(I_{dc})$ of the core loss, but when the rate of change $g(I_{dc})$ of the core loss is already obtained, it is also possible that the change rate computing unit 12 does not calculate the rate of change $g(I_{dc})$ of the core loss. Likewise, in the embodiment described above, the core loss of the magnetic part is measured in step S1, but it is also possible to use exiting data instead of measuring the core loss.

Further, in the embodiment described above, the core loss characteristics $P_{core}$ is first calculated and then the rate of change $g(I_{dc})$ of the core loss is calculated, but it is also possible that the rate of change $g(I_{dc})$ of the core loss is first calculated and then the core loss characteristics $P_{core}$ is calculated. In other words, the order of step S2 and step S3 are not limited.

The procedures described herein, particularly those described with a flowchart, are susceptible of omission of part of the steps constituting the procedure, adding steps not explicitly included in the steps constituting the procedure, and/or reordering the steps. The procedure subjected to such omission, addition, or reordering is also included in the scope of the present invention unless diverged from the purport of the present invention.

What is claimed is:

1. A calculation method comprising:
    measuring core loss of a magnetic part having no superimposed direct current flowing therein for each of a plurality of alternating currents, the magnetic part being made of one or more magnetic materials, each of the plurality of alternating currents having an amplitude different from each other;
    calculating core loss characteristics of the magnetic part having no superimposed direct current flowing therein based on the measured core loss for each of the plurality of alternating currents;
    calculating a value of core loss of the magnetic part by multiplying the core loss characteristics by a rate of change of the core loss of the magnetic part caused by a superimposed direct current; and
    presenting the calculated value of core loss to a user to enable the user to determine if the magnetic part has a low core loss value under an actual use condition.

2. The calculation method according to claim 1 further comprising calculating the rate of change.

3. The calculation method according to claim 1, wherein the core loss characteristics are calculated by Formula (A) below, Formula (A) being formed from the Steinmetz formula with a maximum AC magnetic flux density replaced with an alternating current, $$P_{core}=k'_h I_{ac}^{\beta} f + k'_e (I_{ac} f)^2 + k'_r (I_{ac} f)^{1.5} \tag{A}$$

wherein $P_{core}$ is the core loss characteristics, f is a frequency, $I_{ac}$ is the alternating current, and $k_h'$, $k_e'$, and $k_r'$ are coefficients.

4. The calculation method according to claim 1, wherein the core loss characteristics are calculated by Formula (B) below, Formula (B) being a simplification of the Steinmetz formula with a maximum AC magnetic flux density replaced with an alternating current, $$P_{core}=A \cdot f^{\beta} \cdot I_{ac}^{C} \tag{B}$$

wherein $P_{core}$ is the core loss characteristics, f is a frequency, $I_{ac}$ is an alternating current, and A, B, and C are coefficients.

5. The calculation method according to claim 2, wherein the rate of change of the core loss is calculated by a formula based on an exponential function.

6. The calculation method according to claim 5, wherein the formula is Formula (C) below, $$g(I_{dc})=\exp(-D \cdot I_{dc}^{E}) \tag{C}$$

where $g(I_{dc})$ is the rate of change of the core loss, $I_{dc}$ is the superimposed direct current, and D and E are coefficients.

7. The calculation method according to claim 2, wherein the rate of change of the core loss is calculated by a formula based on an n-th degree function.

8. The calculation method according to claim 7, wherein the formula is Formula (D) below, $$g(I_{dc})=\Sigma_{i=1}^{n}(D_i \cdot I_{dc}^{i})+1 \tag{D}$$

wherein $g(I_{dc})$ is the rate of change of the core loss, $I_{dc}$ is the superimposed direct current, $D_i$ is a coefficient, and i and n are natural numbers.

9. The calculation method according to claim 2, wherein the rate of change of the core loss is calculated by a formula including a multiplication between exponential functions.

10. The calculation method according to claim 9, wherein the formula is Formula (E) below, $$g(I_{dc}) = \exp(-D_1 \cdot I_{dc}^{E1}) \cdot \exp(-D_2 \cdot I_{dc}^{E2}) \cdot \ldots \cdot \exp(-D_n \cdot I_{dc}^{En}) \quad (E)$$

wherein $g(I_{dc})$ is the rate of change of the core loss, $I_{dc}$ is the superimposed direct current, $D_i$ and $E_i$ are coefficients, and i and n are natural numbers.

11. A calculation device comprising one or more computer processors,
wherein the one or more computer processors execute computer-readable instructions to:
measure core loss of a magnetic part having no superimposed direct current flowing therein for each of a plurality of alternating currents, the magnetic part being made of one or more magnetic materials, each of the plurality of alternating currents having an amplitude different from each other;
calculate core loss characteristics of the magnetic part having no superimposed direct current flowing therein based on the measured core loss for each of the plurality of alternating currents;
calculate a value of core loss of the magnetic part by multiplying the calculated core loss characteristics by a rate of change of the core loss of the magnetic part caused by a superimposed direct current, and
present the calculated value of core loss to a user to enable the user to determine if the magnetic part has a low core loss value under an actual use condition.

* * * * *